United States Patent
Wang et al.

(10) Patent No.: US 7,023,079 B2
(45) Date of Patent: Apr. 4, 2006

(54) STACKED SEMICONDUCTOR CHIP PACKAGE

(75) Inventors: Sung-Fei Wang, Kaohsiung (TW); Tsung-Ming Pai, Tainan (TW); Kuang-Hui Chen, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 352 days.

(21) Appl. No.: 10/087,432

(22) Filed: Mar. 1, 2002

(65) Prior Publication Data

US 2002/0125580 A1   Sep. 12, 2002

(30) Foreign Application Priority Data

Mar. 1, 2001   (TW) .............................. 90104684 A

(51) Int. Cl.
  *H01L 23/02*   (2006.01)
  *H01L 29/40*   (2006.01)
  *H01L 23/29*   (2006.01)
  *H01L 23/28*   (2006.01)
  *H01L 29/74*   (2006.01)

(52) U.S. Cl. ...................... 257/686; 257/723; 257/783; 257/790; 257/796

(58) Field of Classification Search ................ 257/777, 257/666, 723, 686; 438/107, 109; 361/790, 361/735

See application file for complete search history.

(56) References Cited

U.S. PATENT DOCUMENTS

| 5,323,060 | A | * | 6/1994 | Fogal et al. ............... 257/724 |
| 5,366,933 | A | * | 11/1994 | Golwalkar et al. ........... 29/827 |
| 5,448,511 | A | * | 9/1995 | Paurus et al. ............. 365/52 |
| 5,861,666 | A | * | 1/1999 | Bellaar ..................... 257/686 |
| 5,894,165 | A | * | 4/1999 | Ma et al. ................... 257/666 |
| 6,005,778 | A | * | 12/1999 | Spielberger et al. ........ 257/686 |
| 6,025,648 | A | * | 2/2000 | Takahashi et al. .......... 257/778 |
| 6,072,243 | A | * | 6/2000 | Nakanishi ................. 257/783 |
| 6,118,184 | A | * | 9/2000 | Ishio et al. ................ 257/666 |
| 6,160,218 | A | * | 12/2000 | Azdasht et al. ............. 174/52.3 |
| 6,252,305 | B1 | * | 6/2001 | Lin et al. ................... 257/777 |
| 6,340,846 | B1 | * | 1/2002 | LoBianco et al. .......... 257/783 |
| 6,351,028 | B1 | * | 2/2002 | Akram ..................... 257/686 |
| 6,563,205 | B1 | * | 5/2003 | Fogal et al. ............... 257/686 |

(Continued)

FOREIGN PATENT DOCUMENTS

JP   60-130854   *   7/1985

(Continued)

*Primary Examiner*—Carl Whitehead, Jr.
*Assistant Examiner*—James Mitchell
(74) *Attorney, Agent, or Firm*—Ladas & Parry LLP

(57) ABSTRACT

The present invention relates to a stacked semiconductor chip package comprising a substrate, a first chip, a plate, and a second chip The first chip is mounted on the substrate. The second chip comprises two opposed longitudinal sides defining a first length. The plate is mounted between the first chip and the second chip, and connects the first chip and the second chip. Corresponding to the two longitudinal sides of the second chip, the plate has two opposed longitudinal sides defining a second length. The second length is larger than the first length to expose the opposed longitudinal sides of the plate. An overflow adhesive portion is formed between the plate and the second chip, and the overflow adhesive portion exposes on the plate. Therefore, the testing instrument can detect the size of the overflow adhesive portion and the thickness of the adhesive layer so as to control the quality of the stacked semiconductor chip package. The adhesion strength between the stacked chip and the plate can be augmented to raise the reliability of the stacked semiconductor chip package product.

6 Claims, 3 Drawing Sheets

U.S. PATENT DOCUMENTS

| | | | |
|---|---|---|---|
| 6,583,512 B1 * | 6/2003 | Nakaoka et al. | 257/777 |
| 6,593,662 B1 * | 7/2003 | Pu et al. | 257/777 |
| 6,650,006 B1 * | 11/2003 | Huang et al. | 257/686 |
| 6,693,350 B1 * | 2/2004 | Teshima et al. | 257/712 |
| 6,740,970 B1 * | 5/2004 | Hiraoka et al. | 257/723 |
| 6,774,473 B1 * | 8/2004 | Shen | 257/686 |
| 2001/0008306 A1 * | 7/2001 | Kamei et al. | 257/723 |
| 2001/0042863 A1 * | 11/2001 | Yamada et al. | 257/78 |
| 2002/0175401 A1 * | 11/2002 | Huang et al. | 257/686 |

FOREIGN PATENT DOCUMENTS

| | | | |
|---|---|---|---|
| JP | 403109760 | * | 5/1991 |
| JP | 404056262 | * | 2/1992 |

* cited by examiner

STACKED SEMICONDUCTOR CHIP PACKAGE

BACKGROUND OF THE INVENTION

1. Field of the Invention

The present invention relates to a semiconductor chip package, more particularly, to a stacked semiconductor chip package.

2. Description of the Related Art

Referring to FIGS. 1a and 1b, the conventional stacked semiconductor chip package 1 comprises a substrate 11, a first chip 12, a plate 13, and a second chip 14. The first chip 12 adheres to the substrate 11 and electrically connects to the substrate 11 by a plurality of leads. The plate 13 is mounted between the first chip 12 and the second chip 14. The size of the plate 13 is usually smaller than that of the first cup 12 so as to avoid interfering the connection of the first chip 12 and the substrate 11, The plate 13 adheres to the first chip 12 by using an adhesive. The second chip 14 is mounted on the plate 13, and adheres to the plate 13 by using an adhesive. Referring to FIG. 1b, because the size of the second chip 14 is larger than that of the plate 13, the testing instrument cannot detect the thickness of the adhesive layer 15 and the size of the overflow adhesive portion 16. If the adhesive layer 14 is too thin or the overflow adhesive portion 16 is too large, the adhesive on the overflow adhesive portion 16 will be broken so that the second chip 14 cannot exactly adhere to the plate 13, which will cause the semiconductor chip package product failure.

Therefore, it is necessary to provide an innovative and progressive semiconductor chip package so as to solve the above problem.

SUMMARY OF THE INVENTION

One objective of the present invention is to provide a stacked semiconductor chip package comprising a substrate, a first chip, a plate and a second chip. The first chip is mounted on the substrate and electrically connects to the substrate by a plurality of electrical leads. The second chip electrically connects to the substrate by a plurality of electrical leads and has two opposed longitudinal sides defining a first length plate is mounted between the first chip and the second chip and connects the first chip and the second chip. Corresponding to the two longitudinal sides of the second chip, the plate has two opposed longitudinal sides defining a second length. The second length is larger than the first length to expose the opposed longitudinal sides of the plate. An overflow adhesive portion is formed between the plate and the second chip, and the overflow adhesive portion exposes on the plate. Therefore, the testing instrument can detect the size of the overflow adhesive portion and the thickness of the adhesive layer so as to control the quality of the stacked semiconductor chip package. The adhesion strength between the second chip and the plate can be augmented to raise the reliability of the stacked semiconductor chip package product.

DETAILED DESCRIPTION OF THE INVENTION

Figure 1A:
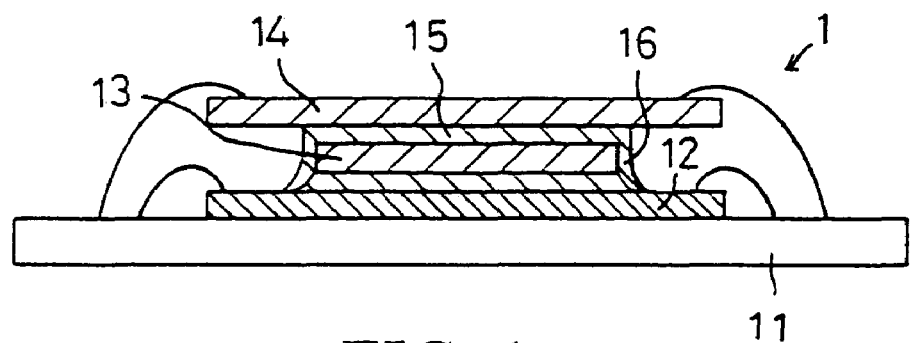
FIG. 1a shows a front and cross-sectional view, according to the conventional stacked semiconductor chip package.
Figure 1B:
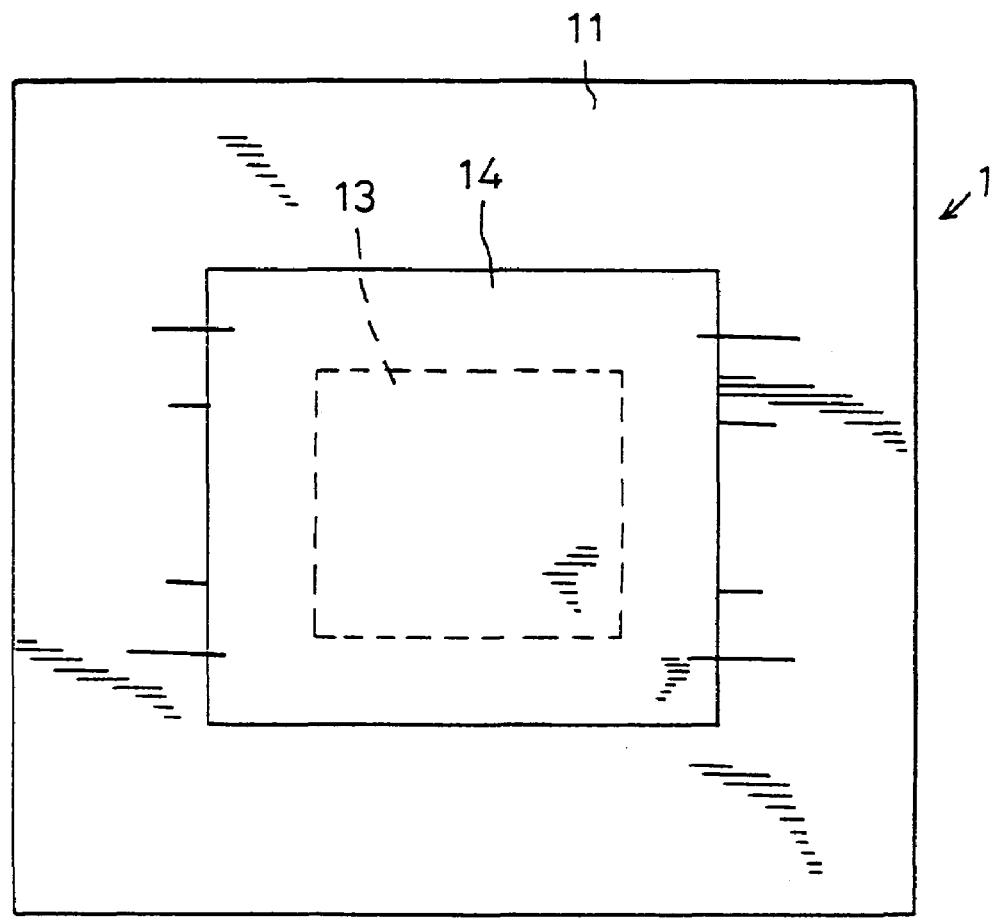
FIG. 1b shows a top plan view, according to the conventional stacked semiconductor chip package.
Figure 2A:
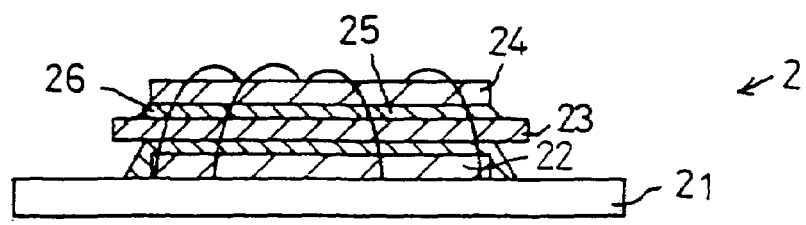
FIG. 2a shows a front and cross-sectional view, according to the first embodiment of the invention.
Figure 2B:
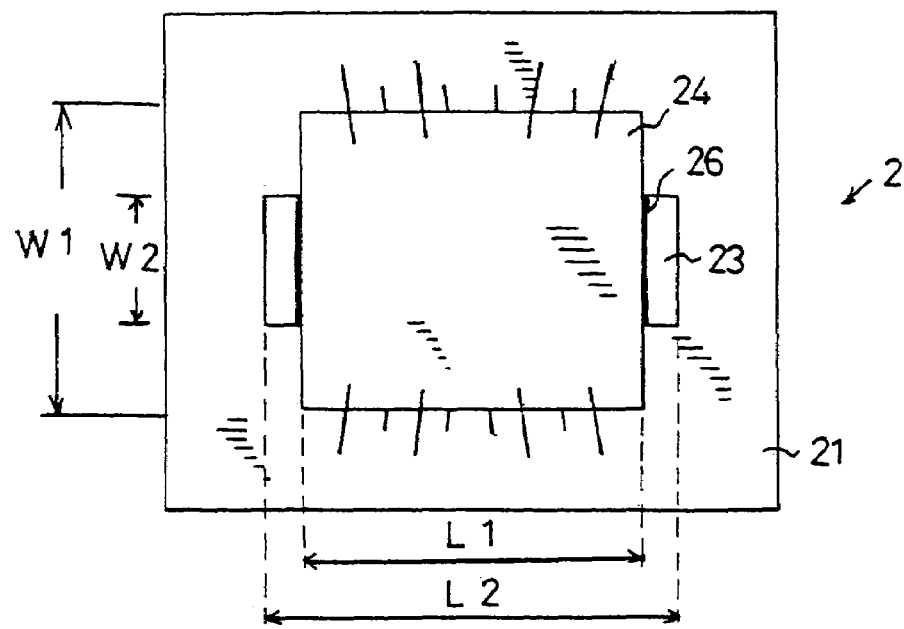
FIG. 2b shows a top plan view, according to the first embodiment of the invention.
Figure 2C:
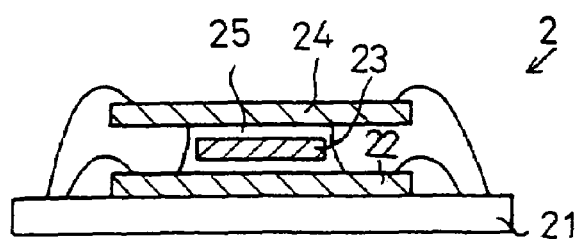
FIG. 2c shows a side and cross-sectional view, according to the first embodiment of the invention.

Referring to FIGS. 2a, 2b, and 2c, according to the first embodiment of the invention, the stacked semiconductor chip package 2 comprises a substrate 21, a first chip 22, a plate 23, and a second chip 24. The first chip 22 is mounted on the top surface of the substrate 21 and electrically connects to the substrate 21 by a plurality of electrical leads, e.g. wires. The plate 23 is mounted between the first chip 22 and the second chip 24, and is stacked on the first chip 22. The plate 23 adheres to the first chip 22 by using and adhesive.

The second chip 24 is mounted on the plate 23, and adheres to the plate 23 by suing an adhesive. Referring to FIG. 2b, the second chip 24 has two opposed longitudinal sides defining a first length L1. Corresponding to the two longitudinal sides of the second chip 24, the plate 23 has two opposed longitudinal sides defining a second length L2. The second length L2 is large than the first length L1 to expose the oppose longitudinal sides of the plate 23. An overflow adhesive portion 26 is formed between the plate 23 and the second chip 24, and the overflow adhesive portion 26 exposes on the plate 23. That is, the portion of the plate 23 under the second chip 24 is wrapped in the adhesive layer 25, and the overflow adhesive portion 26 is exposed at the corner formed by the plate w3 and the second chip 24 alone the longitudinal side of the plate 23. Therefore, the testing instrument can detect the size of the overflow adhesive portion 26 and the thickness of the adhesive layer 25 so as to control the quality of the stacked semiconductor chip package. The adhesion strength between the second chip 24 and the plate 23 can be augmented to raise the reliability of the stacked semiconductor chip package product.

According to the first embodiment of the invention, the size of he first chip 22 is substantially identical with that of the second chip 24. The plate 23 should not entirely cover the first chip 22 so as to have enough space for connecting the first chip 22 and the substrate 21. Corresponding to the two longitudinal sides of the second chip 24, the first chip 22 and the second chip 24 respectively further have two opposed transverse sides defining a first width W1. The plate 23 further has two opposed transverse sides defining a second width W2. The second width W2 is smaller than the first width W1 so as to have enough space for connecting the first chip 22 and the substrate 21.

Figure 3A:
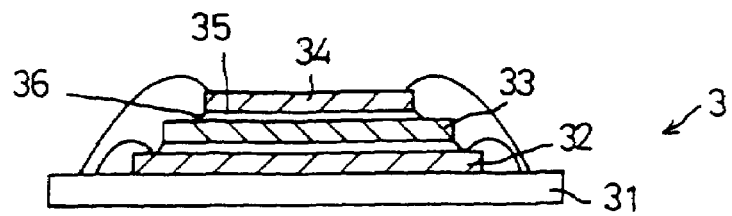
FIG. 3a shows a front and cross-sectional view, according to the second embodiment of the invention.
Figure 3B:
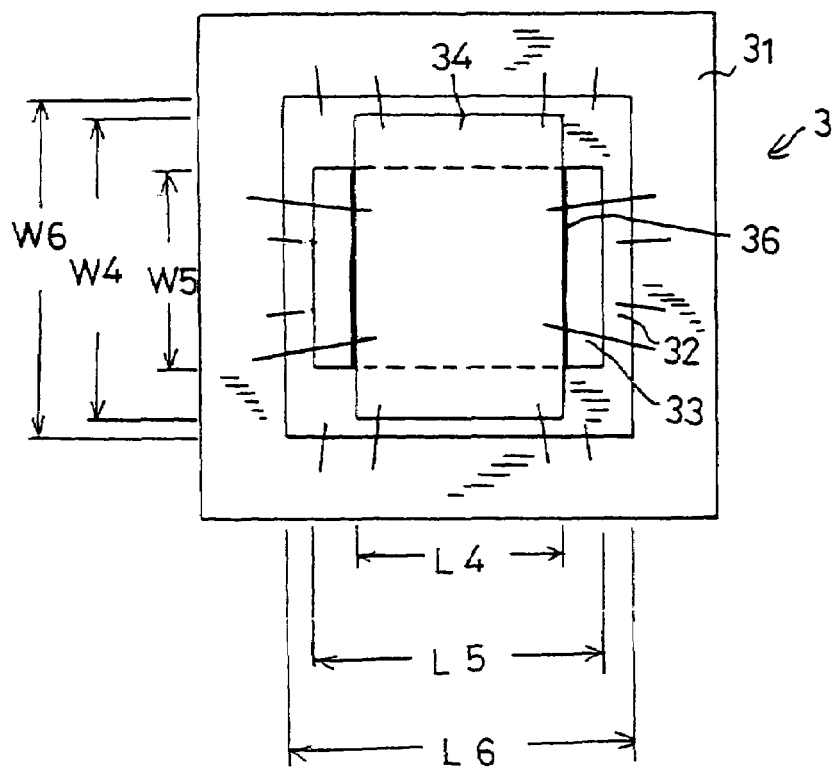
FIG. 3b shows a top plan view, according to the second embodiment of the invention.
Figure 3C:
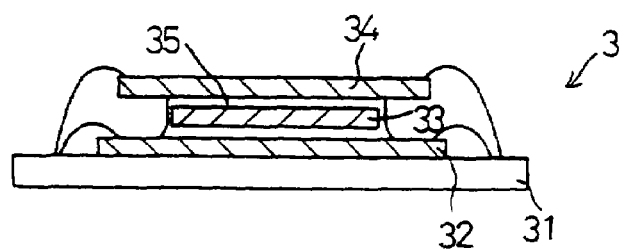
FIG. 3c shows a side and cross-sectional view, according to the second embodiment of the invention.

As shown in FIGS. 3a, 3b, and 3c, according to the second embodiment of the invention, the stacked semiconductor chip package 3 comprises a substrate 31, a first chip 32, a plate 33, and a second chip 34. The structure of the stacked semiconductor chip package 3 of the second embodiment is similar to that of the stacked semiconductor chip package 2 of the first embodiment. The difference between the package 3 and the package 2 is the size of the first chip 32, the plate 33, and the second chip 34.

Referring to FIG. 3b, the second chip 34 has two opposed longitudinal sides defining a first length L4. Corresponding to the two longitudinal sides of the second chip 34, the plate 33 has two opposed longitudinal sides defining a second length L5. The second length L5 is larger than the first length L4 to expose the opposed longitudinal sides of the plate 33. An overflow adhesive portion 36 is formed between the plate 33 and the second chip 34, and the overflow adhesive portion 36 exposes on the plate 33. Therefore, the testing instrument can detect the size of the overflow adhesive portion 36 and the thickness of the adhesive layer 35 so as to control the quality of the stacked semiconductor chip package 3.

Corresponding to the two longitudinal sides of the second chip 34, the first chip 32 has two opposed longitudinal sides defining a third length L6. The third length L6 is larger than the second length L5 so as to have enough space for connecting the first chip 32 and the substrate 31 by using the leads on the opposed longitudinal sides of the first chip 32.

Furthermore, corresponding To the two longitudinal sides of the second chip 34, the second chip 34 further has two opposed transverse sides defining a first width W4. The plate 33 further has two opposed transverse sides defining a second width W5. The first chip 32 further has two opposed transverse sides defining a third width W6. The second width W5 is smaller than the first width W4 and the third width W6 so as to have enough space for connecting the first chip 32 and substrate 31 by using the leads on the opposed transverse sides of the first chip 32.

As the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A stacked semiconductor chip package comprising:
a substrate having a top surface;
a first chip on the top surface of the substrate and electrically connected to the substrate;
a second chip disposed above the first chip and electrically connected to the substrate and having two opposed longitudinal sides defining a first length; and
a plate between the first chip and the second chip, physically connected to the first chip and the second chip directly by adhesive, and having two opposed longitudinal sides corresponding to the two longitudinal sides of the second chip, the plate defining a second length, the second length being larger than the first length to expose the opposed longitudinal sides of the plate and to expose the adhesive between the plate and the second chip,
wherein the portion of the plate under the second chip is wrapped in the adhesive, and the adhesive is exposed at the corner formed by the plate and second chip along the longitudinal side of the plate.

2. A stacked semiconductor chip package comprising:
a substrate having a top surface;
a first chip on the top surface of the substrate and electrically connected to the substrate;
a second chip disposed above the first chip and electrically connected to the substrate and having two opposed longitudinal sides defining a first length; and
a plate between the first chip and the second chip, connected to the first chip and the second chip, and having two opposed longitudinal sides corresponding to the two longitudinal sides of the second chip, the plate defining a second length, the second length being larger than the first length to expose the opposed longitudinal sides of the plate and to expose a adhesive layer formed between the plate and, the second chip, wherein the portion of the plate under the second chip is wrapped in the adhesive layer, and the adhesive layer is exposed at the corner formed by the plate and second chip along the longitudinal side of the plate,
wherein corresponding to the two longitudinal sides of the second chip, the first chip has two opposed longitudinal sides defining a third length, and the third length is larger than the second length.

3. The stacked semiconductor chip package according to claim 2, wherein corresponding to the two longitudinal sides of the second chip, the second chip further has two opposed transverse sides defining a first width, the plate further has two opposed transverse sides defining a second width, the second width is smaller than the first width.

4. The stacked semiconductor chip package according to claim 3, wherein the first chip further has two opposed transverse sides defining a third width, and the second width is smaller than the third width.

5. A stacked semiconductor chip package comprising:
a substrate having a top surface;
a first chip on the top surface of the substrate and electrically connected to the substrate;
a second chip disposed above the first chip and electrically connected to the substrate and having two opposed longitudinal sides defining a first length; and
a plate between the first chip and the second chip, connected to the first chip and the second chip, and having two opposed longitudinal sides corresponding to the two longitudinal sides of the second chip, the plate defining a second length, the second length being larger than the first length to expose the opposed longitudinal sides of the plate and to expose a adhesive layer formed between the plate and the second chip, wherein the portion of the plate under the second chip is wrapped in the adhesive layer, and the adhesive layer is exposed at the corner formed by the plate and second chip along the longitudinal side of the plate,
wherein corresponding to the two longitudinal sides of the second chip, the second chip further has two opposed transverse sides defining a first width, the plate further has two opposed transverse sides defining a second width, the second width is smaller than the first width.

6. The stacked semiconductor chi package according to claim 5, wherein the first chip further has two opposed transverse sides defining a third width, and the second width is smaller than the third width.

* * * * *